United States Patent
Yang et al.

(10) Patent No.: US 9,516,759 B2
(45) Date of Patent: Dec. 6, 2016

(54) MULTILAYER STRUCTURE, FINGERPRINT IDENTIFICATION DEVICE AND MANUFACTURING METHOD THEREOF

(71) Applicant: InnoLux Corporation, Miao-Li County (TW)

(72) Inventors: Yi-Xin Yang, Mico-Li County (TW); Din-Guo Chen, Miao--Li County (TW)

(73) Assignee: INNOLUX CORPORATION, Miao-Li County (TW)

( * ) Notice: Subject to any disclaimer, the term of this patent is extended or adjusted under 35 U.S.C. 154(b) by 96 days.

(21) Appl. No.: 14/477,300

(22) Filed: Sep. 4, 2014

(65) Prior Publication Data
US 2015/0090477 A1    Apr. 2, 2015

(30) Foreign Application Priority Data
Sep. 27, 2013  (TW) .............................. 102135050 A

(51) Int. Cl.
*G06K 9/00* (2006.01)
*H05K 3/28* (2006.01)
*H05K 3/00* (2006.01)

(52) U.S. Cl.
CPC .............. *H05K 3/28* (2013.01); *G06K 9/00053* (2013.01); *H05K 3/285* (2013.01); *H05K 3/0079* (2013.01); *H05K 2201/0191* (2013.01); *H05K 2201/10151* (2013.01); *Y10T 428/24752* (2015.01)

(58) Field of Classification Search
CPC .............. G06K 9/00053; G06K 9/0002; G06K 9/00006; G06K 9/00013; G06K 9/00026
See application file for complete search history.

(56) References Cited

U.S. PATENT DOCUMENTS

| | | | | | |
|---|---|---|---|---|---|
| 3,781,855 | A | * | 12/1973 | Killen | G06K 9/0002 382/126 |
| 5,940,526 | A | * | 8/1999 | Setlak | G06K 9/0002 382/124 |
| 5,963,679 | A | * | 10/1999 | Setlak | G06K 9/0002 382/115 |
| 6,234,031 | B1 | * | 5/2001 | Suga | G06K 9/0002 73/862.474 |
| 6,289,114 | B1 | * | 9/2001 | Mainguet | G06K 9/00026 382/124 |
| 2003/0179001 | A1 | * | 9/2003 | Ito | G06K 9/00053 324/661 |
| 2003/0215976 | A1 | * | 11/2003 | Chou | G06K 9/0002 438/57 |
| 2004/0185590 | A1 | * | 9/2004 | Miyai | G06K 9/00053 438/48 |

(Continued)

FOREIGN PATENT DOCUMENTS

| CN | 1404345 A | 3/2003 |
|---|---|---|
| CN | 101096752 A | 1/2008 |

*Primary Examiner* — Steven T Sawyer
(74) *Attorney, Agent, or Firm* — Muncy, Geissler, Olds & Lowe, P.C.

(57) ABSTRACT

A multilayer structure comprises an insulation material, a conductive layer and a protective film. The conductive layer is disposed on the insulation material. The protective film is disposed on the surface of the conductive layer, and the surface area of the protective film is less than that of the conductive layer. A fingerprint identification device and a manufacturing method thereof are also disclosed.

4 Claims, 10 Drawing Sheets

(56) References Cited

U.S. PATENT DOCUMENTS

| | | | |
|---|---|---|---|
| 2005/0226476 A1* | 10/2005 | Funahashi | G06K 9/00114 382/124 |
| 2005/0231213 A1* | 10/2005 | Chou | G06K 9/00053 324/662 |
| 2010/0096710 A1* | 4/2010 | Chou | G06K 9/0002 257/414 |
| 2012/0187821 A1* | 7/2012 | Lee | H01L 51/5212 313/498 |
| 2013/0082961 A1* | 4/2013 | Wang | G06F 3/044 345/173 |

* cited by examiner

MULTILAYER STRUCTURE, FINGERPRINT IDENTIFICATION DEVICE AND MANUFACTURING METHOD THEREOF

CROSS REFERENCE TO RELATED APPLICATIONS

This Non-provisional application claims priority under 35 U.S.C. §119(a) on Patent Application No(s). 102135050 filed in Taiwan, Republic of China on Sep. 27, 2013, the entire contents of which are hereby incorporated by reference.

BACKGROUND OF THE INVENTION

1. Field of Invention

The invention relates to a multilayer structure and, in particular, to a multilayer structure with diamond-like carbon.

2. Related Art

The current fingerprint identification device can be divided into an optical type and a non-optical type. The optical type of fingerprint identification device is more expensive and highly consumptive of the power (for the light source) and has a larger size (caused by the required distance for the optical imaging and the dimensions of the optical components), so that it's unsuitable for the application of portable electronic products such as notebooks and mobile phones.

The non-optical type of fingerprint identification device includes an electronic fingerprint identification device, an electrostatic induction fingerprint identification device, a capacitive sensing fingerprint identification device, and a thermal sensing fingerprint identification device. The electronic fingerprint identification device also has the problem of high power consumption (the sensing elements thereof will have a current flow during the contact of the two electrodes) and is uneasy to be integrated with the integrated circuit (the manufacturing of piezoelectric material is not compatible for the IC process). The electrostatic induction fingerprint identification device and the capacitive sensing fingerprint identification device are easily affected by dust, sweat on fingers and electromagnetic interference, and a complicated analog circuit is required to read out the tiny electric signal of the sensing element. In manufacturing, although the electrostatic induction fingerprint identification device and the capacitive sensing fingerprint identification device are compatible for the IC process, the high-level IC process is required to result in a better process result, and the cost is increased therefore. Accordingly, the thermal sensing fingerprint identification device is a better option for the application of portable electronic products.

The thermal sensing fingerprint identification device basically includes a heating resistor, a sensing electrode and a temperature sensor. In the thermal sensing fingerprint identification device, the temperature of the sensing electrode is raised by the heating resistor to be over the human temperature and then lowered by the finger contacting the sensing electrode to take some heat away. Then, the thermal sensing fingerprint identification device can obtain a temperature image corresponding to the fingerprint through the temperature sensor.

However, the sensing electrode is easy to be damaged because the user needs to always contact the sensing electrode, and thus the thermal sensing fingerprint identification device will fail in the operation. Moreover, since the user contacts the electrode directly by the finger, the current leakage of the thermal sensing fingerprint identification device may flow to the user's finger through the sensing electrode so that the user may get an electric shock. Besides, the user may receive some toxic substances of the thermal sensing fingerprint identification device through the sensing electrode. Therefore, it is an important subject to protect the sensing electrode from being damaged and let the user safely use the thermal sensing fingerprint identification device.

SUMMARY OF THE INVENTION

In view of the foregoing subject, an objective of the invention is to provide a multilayer structure with diamond-like carbon and a manufacturing method thereof.

Another objective of the invention is to provide a fingerprint identification device characterized by being uneasily damaged.

To achieve the above objective, a multilayer structure according to the invention comprises an insulation material, a conductive layer and a protective film. The conductive layer is disposed on the insulation material. The protective film is disposed on the surface of the conductive layer, and the surface area of the protective film is less than that of the conductive layer, wherein the protective film comprises diamond-like carbon.

A fingerprint identification device according to the invention comprises a substrate, a fingerprint sensing circuit, an insulation material, a conductive layer and a protective film. The fingerprint sensing circuit is disposed on the substrate. The insulation material is disposed on the fingerprint sensing circuit. The conductive layer is disposed on the insulation material. The protective film is disposed on the surface of the conductive layer, and the surface area of the protective film is less than that of the conductive layer, wherein the protective film comprises diamond-like carbon.

In one embodiment, the conductive layer has a remaining region surrounding the protective film, the surface of the remaining region and the surface of the protective film have a sectional difference therebetween, and the sectional difference is extended from the surface of the protective film to incline towards the surface of the remaining region with a decreasing inclined angle.

In one embodiment, the surface area of the conductive layer is substantially equal to that of the insulation material.

To achieve the above objective, a manufacturing method of the multilayer structure according to the invention comprises steps of: providing an insulation material; forming a conductive layer on the insulation material; fixing a mask to the conductive layer, the mask including a plurality of opening; applying a bias to the mask and depositing a protective film on the surfaces of the conductive layer respectively corresponding to the openings, wherein the protective film comprises diamond-like carbon; and removing the mask.

In one embodiment, each of the openings is arranged in an array, and each of the openings is shaped like a rectangle, a circle or other geometric patterns.

In one embodiment, the manufacturing method further comprises steps of: providing a substrate including a fingerprint sensing circuit; and covering the fingerprint sensing circuit by the insulation material.

In one embodiment, the manufacturing method further comprises steps of: fixing a magnetic plate to the surface of the insulation material opposite to the conductive layer; and attracting the mask to the conductive layer by a magnetic field of the magnetic plate, wherein the mask has magnetism.

As mentioned above, since the protective film is formed over the fingerprint sensing circuit, the structure of the invention can be protected from being damaged. Besides, because the bias is applied to the mask which includes a plurality of the openings to form the protective film, the surfaces of the conductive layer respectively corresponding to the openings will undergo an average bias of smaller area, and therefore the protective film can be enhanced in hardness and stability. Moreover, the mask is used to form the protective film, which indicates that the protective film can be formed over many fingerprint sensing circuits at one time to save the time of the manufacturing process. Furthermore, the mask doesn't need to be taken out of the vacuum room during the mask cleaning procedure, so the time of the manufacturing process can be saved further.

BRIEF DESCRIPTION OF THE DRAWINGS

The invention will become more fully understood from the detailed description and accompanying drawings, which are given for illustration only, and thus are not limitative of the present invention, and wherein.

DETAILED DESCRIPTION OF THE INVENTION

The present invention will be apparent from the following detailed description, which proceeds with reference to the accompanying drawings, wherein the same references relate to the same elements.

Figure 1A:
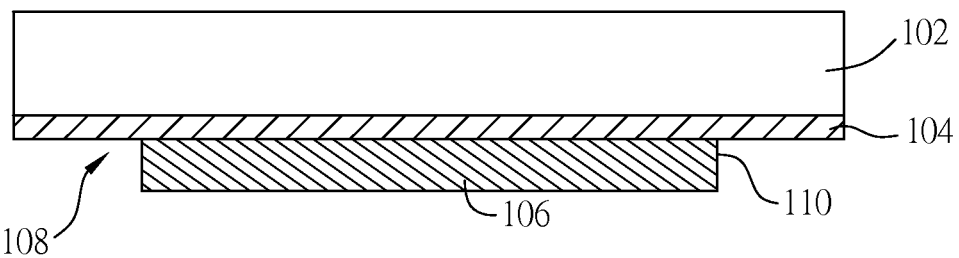
FIGS. 1A and 1B are schematic diagrams of a multiplayer structure according to an embodiment of the invention.
Figure 1B:
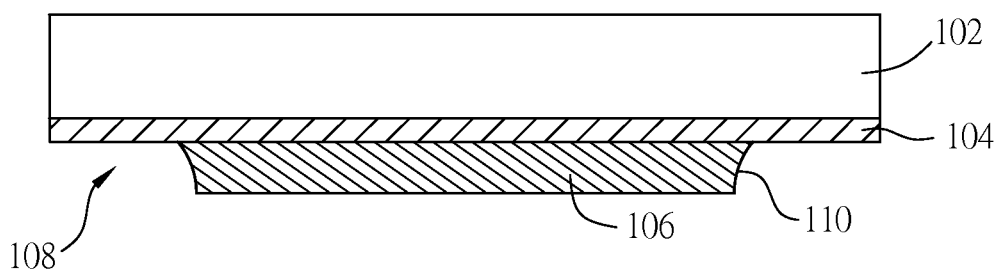

FIGS. 1A and 1B are schematic diagrams of a structure with diamond-like carbon according to an embodiment of the invention. As shown in FIGS. 1A and 1B, the structure 100 includes an insulation material 102, a conductive layer 104 and a diamond-like carbon film 106. The insulation material 102 can be a film or a plate. The conductive layer 104 is disposed on the insulation material 102. As an embodiment, the surface area of the conductive layer 104 is equal to that of the insulation material 102. The diamond-like carbon film 106 is disposed on the conductive layer 104. In particular, the surface area of the diamond-like carbon film 106 is less than that of the conductive layer 104. Herein, the region 108 of the conductive layer 104 covered by the mask (such as the mask 400 in FIGS. 3A and 3B) is defined as the remaining region. The surface of the remaining region 108 and the surface of the diamond-like carbon film 106 have a sectional difference 110 therebetween, as shown in FIG. 1A. As an embodiment, the remaining region 108 surrounds the diamond-like carbon film 106.

In this embodiment, the thickness of the conductive layer 104 is between 10 Å and 10000 Å. Moreover, the thickness of the diamond-like carbon film 106 is between 0.01 μm and 10 μm. Favorably, the thickness of the diamond-like carbon film 106 is between 0.1 μm and 1.5 μm.

As an embodiment, when the diamond-like carbon film 106 is deposited on the conductive layer 104 through the mask (such as the mask 400 in FIGS. 3A and 3B), it will permeate the remaining region 108. So, the sectional difference 110 will be made as extended from the surface of the diamond-like carbon film 106 to incline towards the surface of the remaining region 108 with a decreasing inclined angle, as shown in FIG. 1B.

Figure 2:
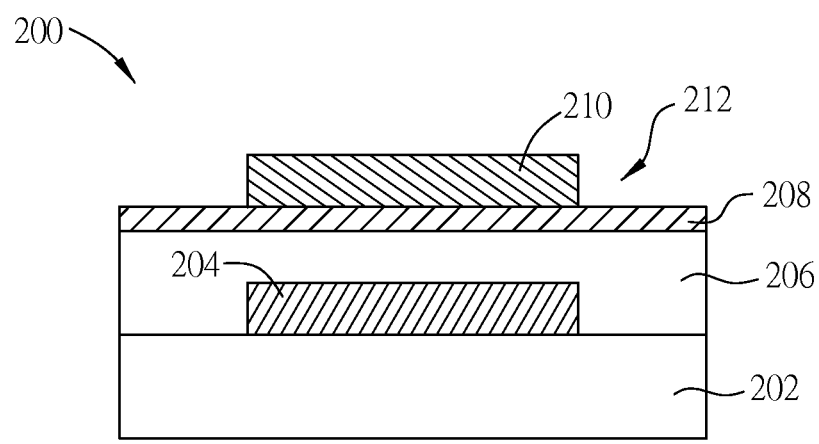
FIG. 2 is a schematic diagram of a fingerprint identification device according to an embodiment of the invention.

FIG. 2 is a schematic diagram of a fingerprint identification device according to an embodiment of the invention. As shown in FIG. 2, the fingerprint identification device 200 of this embodiment uses the structure in FIG. 1A or 1B. In this embodiment, the fingerprint identification device 200 includes a substrate 202, and a fingerprint sensing circuit 204 including sensing electrode is formed on the substrate 202. Moreover, the insulation material 206 is formed on the substrate 202 to cover the fingerprint sensing circuit 204. The insulation material 206 is equivalent to the insulation material 102 in FIG. 1A. A conductive layer 208 is formed on the insulation material 206, and a diamond-like carbon film 210 is formed on the conductive layer 208.

The diamond-like carbon film 210 is equivalent to the diamond-like carbon film 106 in FIG. 1A, and the surface area of the diamond-like carbon film 210 is less than that of the conductive layer 208. Therefore, the remaining region 212 of the conductive layer 208 that is not covered by the diamond-like carbon film 210 will surround the diamond-like carbon film 210. As an embodiment, the region which the diamond-like carbon film 210 is located in is corresponding to the region of the fingerprint sensing circuit 204. Therefore, the diamond-like carbon film 210 can protect the fingerprint sensing circuit 204 from being damaged by the user's pressing, and the current leakage and toxic substances can be prevented from contacting the user's finger.

Figure 3A:
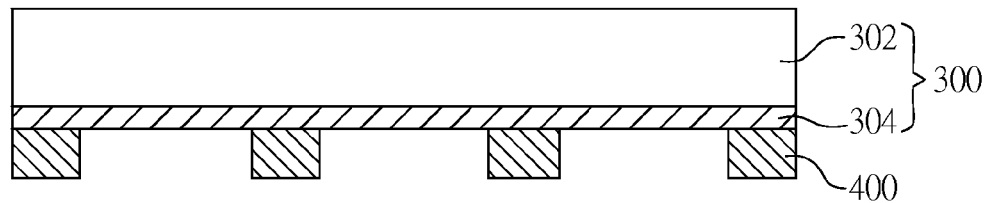
FIGS. 3A to 3D are schematic diagrams of the manufacturing method of the multiplayer structure according to an embodiment of the invention.

FIGS. 3A to 3D are schematic diagrams of the manufacturing method of the structure with diamond-like carbon according to an embodiment of the invention. As shown in FIG. 3A, a mask 400 is fixed to a mother material 300 in order to manufacture the structure 100. The mask 400 has many openings 402 as shown in FIG. 4, and the mask 400 favorably includes a conductive material, such as ceramic or metal material. As an embodiment, the openings 402 are arranged in an array, but this invention is not limited thereto. The opening 402 can be shaped like a rectangle, a circle or other geometric patterns. In this embodiment, the mother material 300 includes the insulation material 302 and the conductive layer 304, and the conductive layer 304 is formed on the insulation material 302.

Figure 3B:
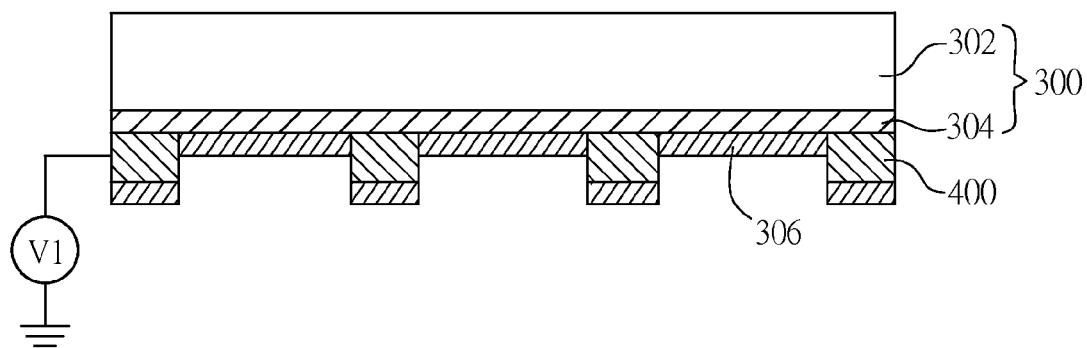
Figure 3C:
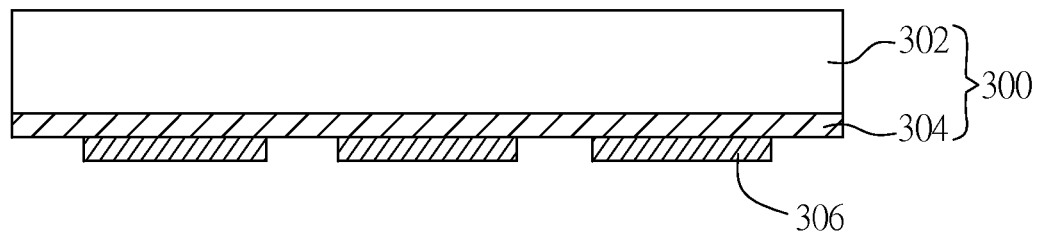
Figure 3D:
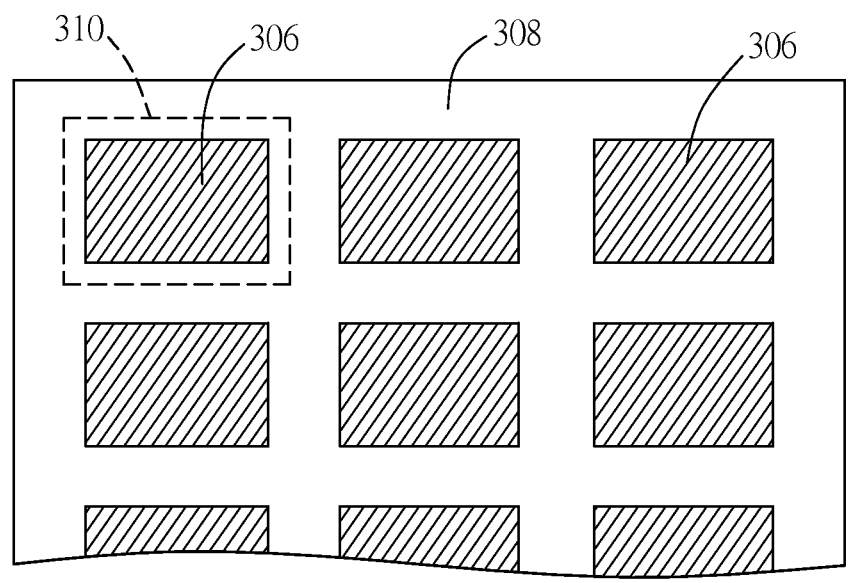
Figure 4:
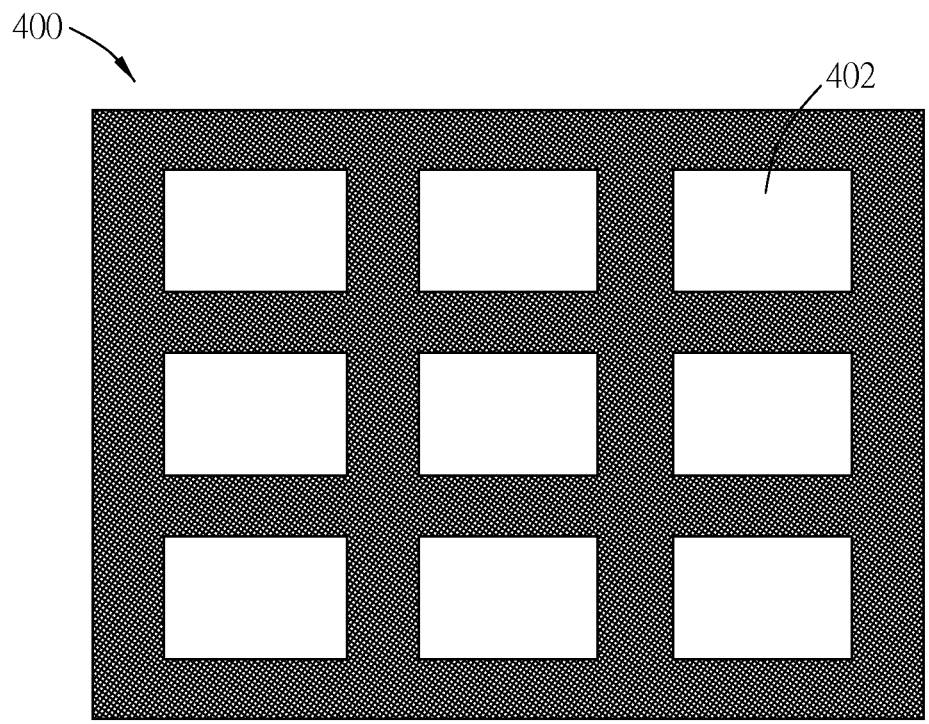
FIG. 4 is a schematic top view of the mask according to an embodiment of the invention.

As shown in FIG. 3B, the diamond-like carbon can be deposited on the mask 400 by physical vapor deposition or reactive physical vapor deposition when a bias V1 is applied to the mask 400 and the gas containing carbon is provided in. Meanwhile, the diamond-like carbon is also deposited on the conductive layer 304 through the openings 402 of the mask 400 to form the diamond-like carbon film 306. Because the bias V1 is applied to the mask 400 which includes a plurality of the openings 402 to form the diamond-like carbon film 306, the surfaces of the conductive layer 304 respectively corresponding to the openings 402 will undergo an average bias of smaller area, and therefore the diamond-like carbon film 306 will be formed on the said surfaces of the conductive layer 304 with a uniform film thickness. In FIG. 3C, when the mask 400 is removed, several separate diamond-like carbon films 306 will be formed on the conductive layer 304. In FIG. 3D, a top view of the mother material 300 in FIG. 3C, the remaining region 308 surrounds each of the diamond-like carbon films 306. Then, a plurality of structures 100 as shown in FIG. 1A can be obtained when the cutting is implemented along the remaining region 308, such as along a dotted line 310 at an interval from the edge of the diamond-like carbon film 306.

Figure 5:
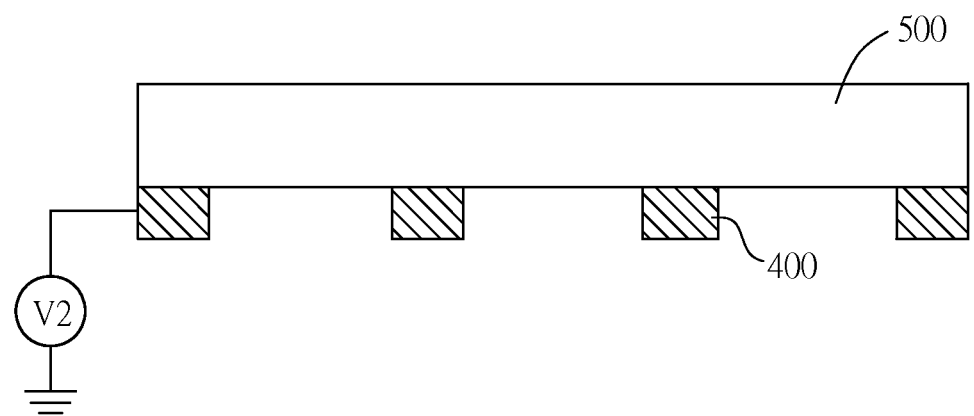
FIG. 5 is a schematic diagram of a mask cleaning step according to an embodiment of the invention.

The diamond-like carbon will remain on the mask 400 when the above-mentioned process is implemented. Therefore, a mask cleaning step is provided as shown in FIG. 5 schematically. First, a cleaning substrate 500 is fixed to the mask 400 in order to avoid the diamond-like carbon remaining on the mask 400 from permeating the backside of the mask 400. Then, an operative voltage V2 is applied to the mask 400 and a cleaning gas is provided. Since the operative voltage V2 can be up to the level of radio frequency, the cleaning gas will become oxidation plasma and remove the diamond-like carbon remaining on the mask 400, and the procedure of cleaning mask 400 is thus completed.

Figure 6:
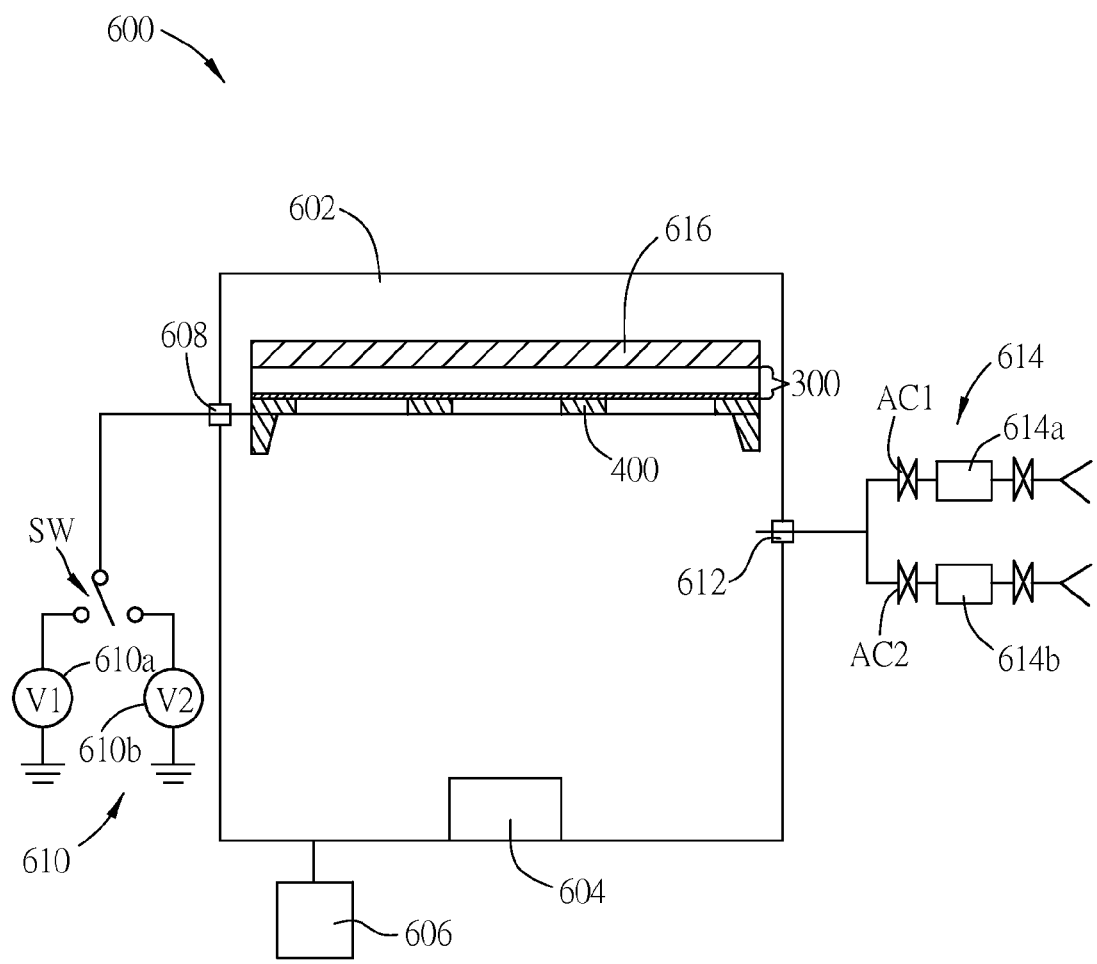
FIG. 6 is a schematic diagram of a physical vapor deposition (PVD) apparatus of the manufacturing method of the multiplayer structure according to an embodiment of the invention.

FIG. 6 is a schematic diagram of a physical vapor deposition (PVD) apparatus of the manufacturing method of the structure with diamond-like carbon according to an embodiment of the invention. As shown in FIG. 6, the PVD apparatus 600 includes a vacuum room 602, which has a diamond-like carbon source 604 and can be connected to a pressure adjuster 606. Moreover, the vacuum room 602 has an electric connection interface 608 which can be coupled with a power supplying system 610. In this embodiment, the vacuum room 602 also has at least a gas flowing opening 612 which can be connected to a gas supplying system 614.

In this embodiment, the power supplying system 610 includes powers 610a and 610b and a switch SW. The switch SW is coupled to the electric connection interface 608 and can switch the power 610a or 610b to the electric connection interface 608 according to the user's operation.

The gas supplying system 614 includes an auxiliary-gas storing room 614a and a cleaning-gas storing room 614b. The auxiliary-gas storing room 614a is connected to the gas flowing opening 612 through a gas valve AC1, and the cleaning-gas storing room 614b is connected to the gas flowing opening 612 through a gas valve AC2. The auxiliary-gas storing room 614a stores an auxiliary gas such as a hydrocarbon and gases like H2, Ar, He, Ne, N2. The cleaning-gas storing room 614b stores a cleaning gas, such as O2, O3, N2O.

In particular, a magnetic plate 616 is disposed in the vacuum room 602 to attract the mask 400 through the mother material 300 and fix the mask 400 to the mother material 300. Because the mask 400 needs to be fixed to the mother material 300 in this embodiment, it's favorable to provide a better electric contact between the mask 400 and the conductive layer 304 of the mother material 300. Therefore, the mask 400 in this embodiment is favorably made by soft magnetic material.

As shown in FIG. 6, when the diamond-like carbon film is formed on the mother material 300, the switch SW will switch the power 610a to connect to the electric connection interface 608. The power 610a can be a DC power or an AC power. In this embodiment, the electric connection interface 608 can be coupled to the mask 400 so that the mask 400 can be given the bias V1. The gas valve AC1 will be opened, and the auxiliary gas stored in the auxiliary-gas storing room 614a will be sent to the vacuum room 602. Then, the diamond-like carbon source 604 is started to release carbon particles, and the diamond-like carbon can be deposited on the mother material 300 by PVD or reactive PVD to form the diamond-like carbon film. When the thickness of the diamond-like carbon film reaches a predetermined value, the deposition operation can be stopped and the mother material 300 can be taken out. Then, a new mother material is used to replace the old mother material and the deposition operation can be resumed.

When the diamond-like carbon remaining on the mask 400 is accumulated to reach a certain thickness, the diamond-like carbon may come off the mask 400. Therefore, the mask 400 needs to be cleaned up regularly. When the mask 400 needs to be cleaned, it's unnecessary to take the mask 400 out of the vacuum room but the mother material that has been coated with diamond-like carbon needs to be replaced by a cleaning substrate. Then, the mask 400 is fixed to the cleaning substrate, and the switch SW switches the power 610b to connect to the electric connection interface 608 to apply the operative voltage V2 to the mask 400. Besides, the gas valve AC1 is closed and the gas valve AC2 is opened. Accordingly, the cleaning gas stored in the cleaning-gas storing room 614b will be sent to the vacuum room 602 through the gas flowing opening 612 to clean the mask 400.

Figure 7:
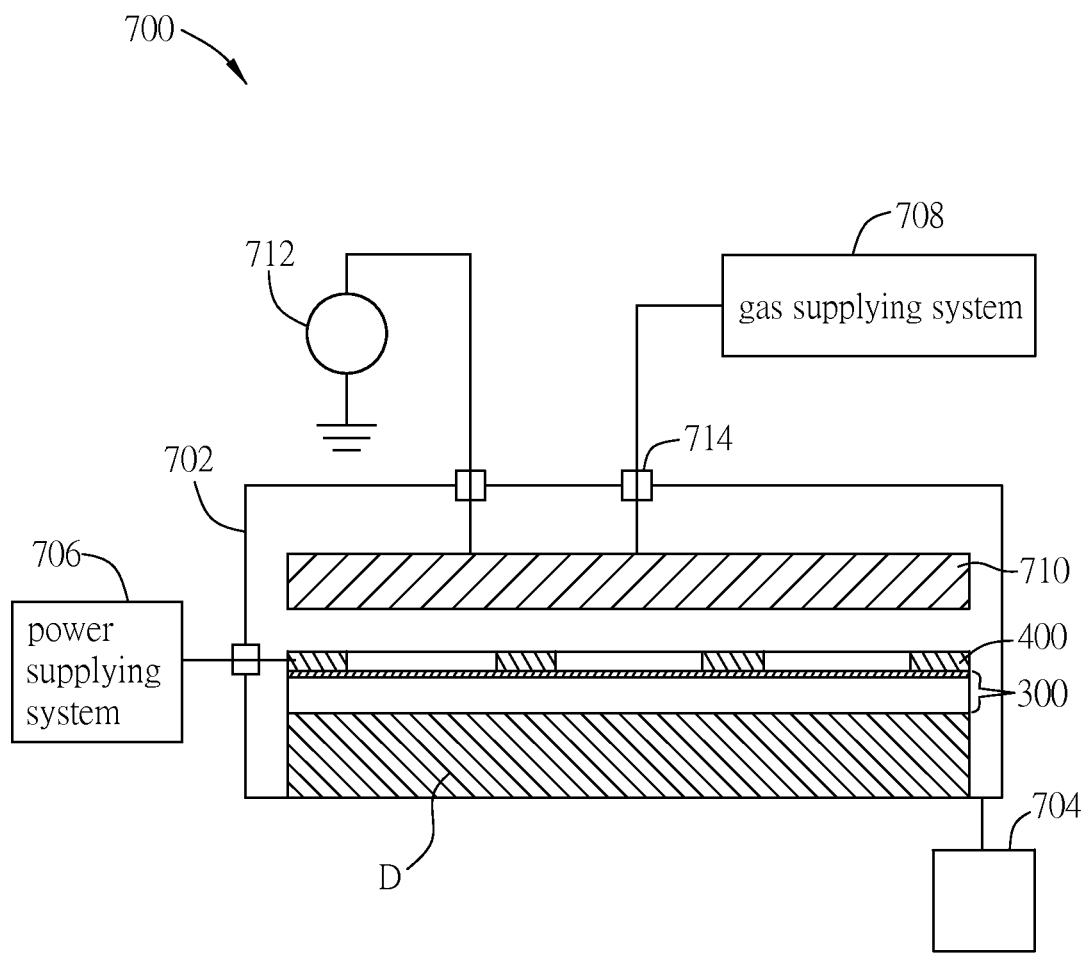
FIG. 7 is a schematic diagram of a chemical vapor deposition (CVD) apparatus of the manufacturing method of the multiplayer structure according to an embodiment of the invention.

FIG. 7 is a schematic diagram of a chemical vapor deposition (CVD) apparatus of the manufacturing method of the structure with diamond-like carbon according to an embodiment of the invention. As shown in FIG. 7, the CVD apparatus 700 of this embodiment also includes a vacuum room 702, which is, likewise, coupled to a pressure adjustor 704, a power supplying system 706 and a gas supplying system 708. The vacuum room 702 includes a gas spraying board 710, which is coupled to a main power 712 for operation. In this embodiment, the gas spraying board 710 is equivalent to the diamond-like carbon source 604 in FIG. 6. So, the operations of the power supplying system 706, the gas supplying system 708 and the gas spraying board 710 can be comprehended by referring to the embodiment of FIG. 6, and therefore they are not described here for conciseness. Moreover, the mother material 300 is disposed on a stage D. In particular, the gas spraying board 710 is connected to the gas supplying system 708 through the gas flowing opening 714. Accordingly, the auxiliary gas and the cleaning gas also can be sent to the vacuum room 702 through the gas spraying board 710. When the auxiliary gas is provided in, the diamond-like carbon can be deposited on the mother material 300 by CVD to form the diamond-like carbon film.

Figure 8:
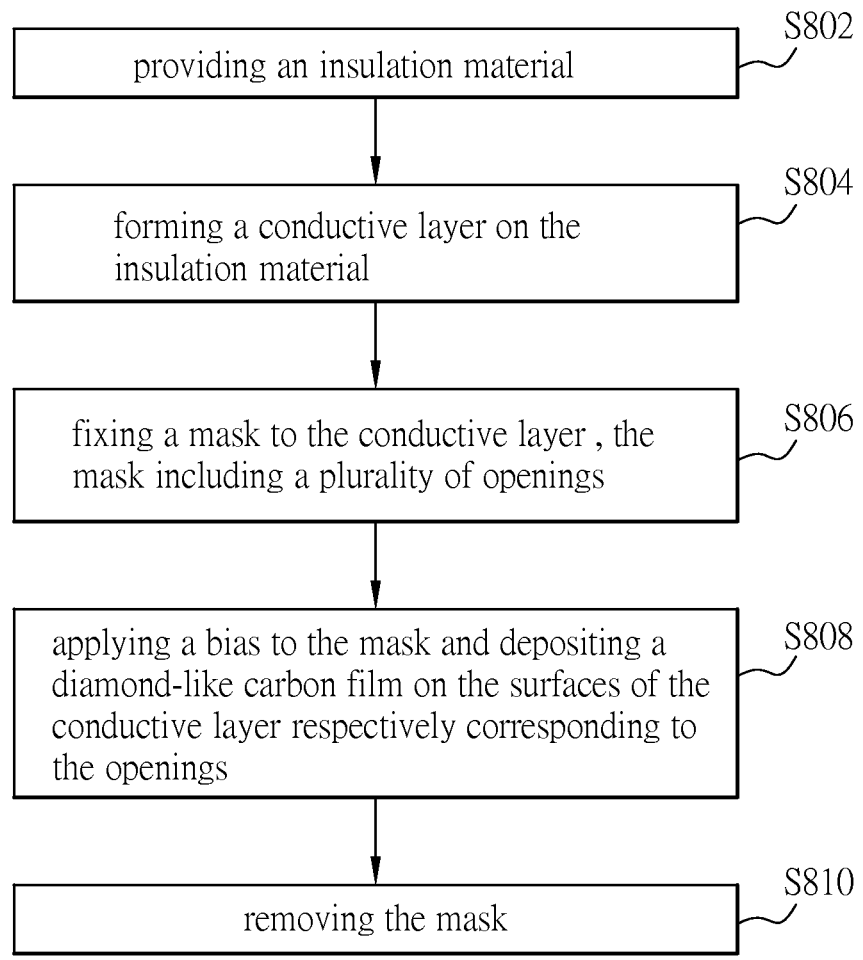
FIG. 8 is a schematic flowchart of the manufacturing method of the multiplayer structure according to an embodiment of the invention.

FIG. 8 is a schematic flowchart of the manufacturing method of the structure with diamond-like carbon according to an embodiment of the invention. As shown in FIG. 8, the step S802 is providing an insulation material. The step S804 is forming a conductive layer on the insulation material. The step S806 is fixing a mask to the conductive layer. The mask includes a plurality of opening as mentioned above. In other embodiments, a magnetic plate can be fixed to the surface of the insulation material opposite to the conductive layer to attract the mask to the conductive layer by a magnetic field, and the mask has magnetism. Then, the step S808 is applying a bias to the mask and depositing a diamond-like carbon film on the surfaces of the conductive layer respectively corresponding to the openings. In this situation, the above-mentioned remaining region exists around the diamond-like carbon film. The step S810 is removing the mask, and the structure as shown in FIG. 1A can be obtained by implementing the cutting along the remaining region.

Figure 9:
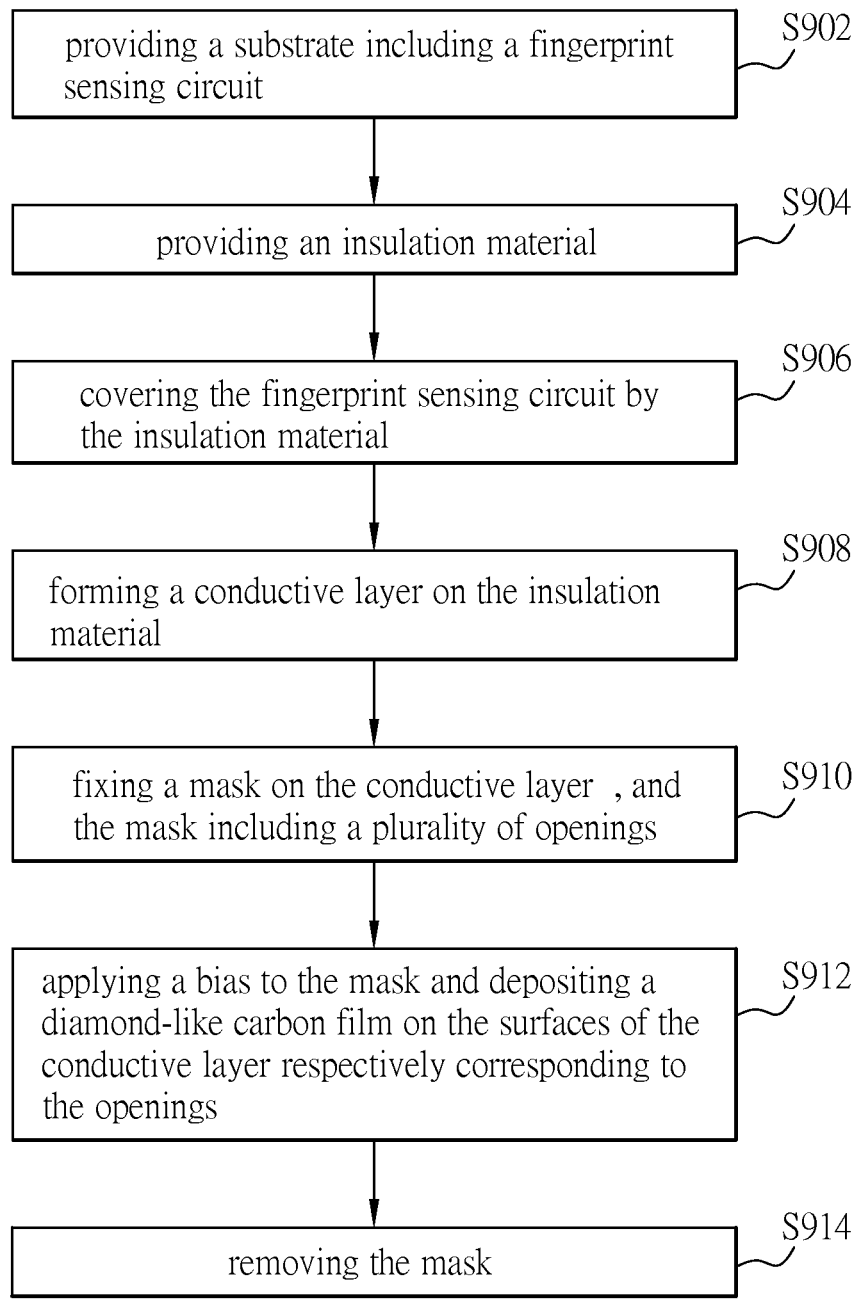
FIG. 9 is a schematic flowchart of the manufacturing method of the fingerprint identification device according to an embodiment of the invention.

FIG. 9 is a schematic flowchart of the manufacturing method of the fingerprint identification device according to an embodiment of the invention. As shown in FIG. 9, the steps of manufacturing the fingerprint identification device are approximately similar to the steps of manufacturing the structure with diamond-like carbon, and the main difference between them is illustrated as below. The step S902 is providing a substrate including a fingerprint sensing circuit. Then, the step S906 is covering the fingerprint sensing circuit by the insulation material provided in the step S904. Since the steps S908~S914 are similar to the steps S802~S810, they are not described here for conciseness.

Figure 10:
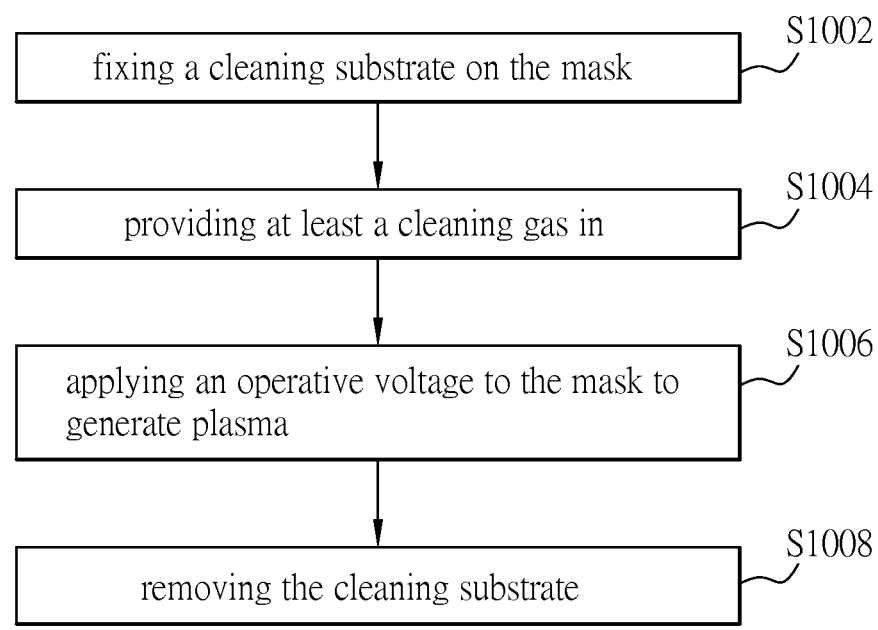
FIG. 10 is a schematic flowchart of the method of cleaning the mask according to an embodiment of the invention.

FIG. 10 is a schematic flowchart of the method of cleaning the mask according to an embodiment of the invention. As shown in FIG. 10, the step S1002 is fixing a cleaning substrate to the backside of the mask as shown in FIG. 5. Then, the step S1004 is providing at least a cleaning gas in. The step S1006 is applying an operative voltage to the mask to make the cleaning gas become plasma so as to remove the diamond-like carbon remaining on the mask. The step S1008 is removing the cleaning substrate to complete the mask cleaning procedure.

Summarily, since the diamond-like carbon film is formed over the fingerprint sensing circuit, the structure of the invention can be protected from being damaged. Besides, because the bias is applied to the mask which includes a plurality of the openings to form the diamond-like carbon film, the surfaces of the conductive layer respectively corresponding to the openings will undergo an average bias of smaller area, and therefore the diamond-like carbon film can be enhanced in hardness and stability. Moreover, the mask is used to form the diamond-like carbon film, which indicates that the diamond-like carbon film can be formed over many fingerprint sensing circuits at one time to save the time of the manufacturing process. Furthermore, the mask doesn't need to be taken out of the vacuum room during the mask cleaning procedure, so the time of the manufacturing process can be saved further.

Although the invention has been described with reference to specific embodiments, this description is not meant to be construed in a limiting sense. Various modifications of the disclosed embodiments, as well as alternative embodiments, will be apparent to persons skilled in the art. It is, therefore, contemplated that the appended claims will cover all modifications that fall within the true scope of the invention.

What is claimed is:

1. A multilayer structure, comprising:
    an insulation material;
    a conductive layer disposed on the insulation material; and
    a protective film disposed on the surface of conductive layer, wherein the surface area of the protective film is less than that of the conductive layer, wherein the protective film comprises diamond-like carbon;
    wherein the conductive layer has a remaining region surrounding the protective film, the surface of the remaining region and the surface of the protective film have a sectional difference therebetween, and the sectional difference is extended from the surface of the protective film to incline towards the surface of the remaining region.

2. The multilayer structure as recited in claim 1, wherein the surface area of the conductive layer is substantially equal to that of the insulation material.

3. A fingerprint identification device, comprising:
    a substrate;
    a fingerprint sensing circuit disposed on the substrate;
    an insulation material disposed on the fingerprint sensing circuit;
    a conductive layer disposed on the insulation material; and
    a protective film disposed on the surface of the conductive layer, wherein the surface area of the protective film is less than that of the conductive layer, wherein the protective film comprises diamond-like carbon;
    wherein the conductive layer has a remaining region surrounding the protective film, the surface of the remaining region and the surface of the protective film have a sectional difference therebetween, and the sectional difference is extended from the surface of the protective film to incline towards the surface of the remaining region.

4. The fingerprint identification device as recited in claim 3, wherein the surface area of the conductive layer is substantially equal to that of the insulation material.

* * * * *